United States Patent
Yoo (10) Patent No.: US 9,576,977 B2
(45) Date of Patent: Feb. 21, 2017

(54) SEMICONDUCTOR DEVICE AND METHOD OF MANUFACTURING THE SAME

(71) Applicant: SK hynix Inc., Gyeonggi-do (KR)

(72) Inventor: Deung Kak Yoo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/989,346

(22) Filed: Jan. 6, 2016

(65) Prior Publication Data

US 2016/0118403 A1 Apr. 28, 2016

Related U.S. Application Data

(63) Continuation of application No. 14/495,558, filed on Sep. 24, 2014, now Pat. No. 9,263,596.

(30) Foreign Application Priority Data

May 13, 2014 (KR) ........................ 10-2014-0057247

(51) Int. Cl.
| H01L 29/792 | (2006.01) |
| H01L 27/115 | (2006.01) |
| H01L 21/28 | (2006.01) |
| H01L 21/311 | (2006.01) |

(52) U.S. Cl.
CPC ... *H01L 27/11582* (2013.01); *H01L 21/28282* (2013.01); *H01L 21/31111* (2013.01); *H01L 27/1158* (2013.01); *H01L 29/792* (2013.01); *H01L 29/7926* (2013.01)

(58) Field of Classification Search
CPC .................. H01L 27/11551; H01L 27/11578; H01L 29/7827; H01L 29/0657; H01L 21/28282
See application file for complete search history.

(56) References Cited

U.S. PATENT DOCUMENTS

| 2009/0242966 A1* | 10/2009 | Son | H01L 27/11578 257/324 |
| 2010/0155818 A1* | 6/2010 | Cho | H01L 27/11578 257/324 |
| 2011/0298013 A1* | 12/2011 | Hwang | H01L 27/11551 257/208 |
| 2011/0298037 A1* | 12/2011 | Choe | G11C 16/0483 257/324 |
| 2012/0012920 A1* | 1/2012 | Shin | H01L 27/11578 257/324 |
| 2012/0115293 A1* | 5/2012 | Noh | H01L 27/10855 438/239 |
| 2012/0168848 A1* | 7/2012 | Ahn | H01L 21/28282 257/324 |

(Continued)

*Primary Examiner* — Reema Patel
*Assistant Examiner* — Syed Gheyas
(74) *Attorney, Agent, or Firm* — IP & T Group LLP (57) ABSTRACT

A semiconductor device includes a channel layer including a sidewall having protrusions and depressions alternating with each other in a direction in which the channel layer extends, a tunnel insulating layer surrounding the channel layer, first charge storage patterns surrounding the tunnel insulating layer formed in the depressions, blocking insulation patterns surrounding the first charge patterns formed in the depressions, wherein the blocking insulating patterns include connecting portions coupled to the tunnel insulating layer, and second charge storage patterns surrounding the tunnel insulating layer formed in the protrusions.

5 Claims, 9 Drawing Sheets

(56) References Cited

U.S. PATENT DOCUMENTS

| | | | |
|---|---|---|---|
| 2012/0213009 A1* | 8/2012 | Aritome | G11C 16/0408 365/185.29 |
| 2013/0087843 A1* | 4/2013 | Han | B82Y 10/00 257/315 |
| 2013/0168800 A1* | 7/2013 | Shim | H01L 29/0657 257/499 |
| 2013/0171788 A1* | 7/2013 | Yang | H01L 29/7827 438/268 |
| 2014/0084357 A1* | 3/2014 | Choi | H01L 27/1157 257/324 |

* cited by examiner

SEMICONDUCTOR DEVICE AND METHOD OF MANUFACTURING THE SAME

CROSS-REFERENCE TO RELATED APPLICATION

This application is a continuation of U.S. patent application Ser. No. 14/495,558 filed on Sep. 24, 2014, which claims priority to Korean patent application number 10-2014-0057247, filed on May 13, 2014. The disclosure of each of the foregoing applications is herein incorporated by reference in its entirety.

BACKGROUND

Field of Invention

Various exemplary embodiments relate generally to a semiconductor device and a method of manufacturing the same, and more particularly, to a three-dimensional semiconductor device and a method of manufacturing the same.

Description of Related Art

A semiconductor device may include a memory device capable of storing data. The memory device may include memory cell strings. Each of the memory cell strings may include memory cells.

Recently, to increase the degree of integration in semiconductor devices, three-dimensional (3D) memory devices have been proposed in which memory cells forming memory strings are stacked in a plurality of layers over a substrate. The 3D memory device may include a stacked structure including word lines and interlayer insulating layers which are stacked alternately with each other, a channel layer passing through the stacked structure, and a charge storage layer formed between the stacked structure and the channel layer. Memory cells may be formed at intersections between the word lines and the channel layer. The memory cells may store charges in portions of the charge storage layer which are formed at the intersections between the word lines and the channel layer. The charges stored in the portions of the charge storage layer may move in a vertical direction along the charge storage layer. Therefore, the reliability of the 3D memory device may deteriorate.

SUMMARY

Exemplary embodiments are directed to a semiconductor device and a method of manufacturing the same that can improve reliability of a three-dimensional memory device.

A semiconductor device according to an embodiment may include a channel layer including a sidewall having protrusions and depressions alternating with each other in a direction in which the channel layer extends, a tunnel insulating layer surrounding the channel layer, first charge storage patterns surrounding the tunnel insulating layer formed in the depressions, blocking insulation patterns surrounding the first charge storage patterns formed in the depressions, wherein the blocking insulating patterns include connecting portions coupled to the tunnel insulating layer, and second charge storage patterns surrounding the tunnel insulating layer formed in the protrusions.

A semiconductor device according to an embodiment may include a channel layer extending from a first region to a second region, a conductive pattern surrounding the channel layer in the first region, an interlayer insulating pattern surrounding the channel layer in the second region, a first charge storage pattern extending between the channel layer and the conductive pattern, a second charge storage pattern extending between the channel layer and the interlayer insulating pattern, and a blocking insulation pattern extending from between the first charge storage pattern and the conductive pattern to between the channel layer and edges of the interlayer insulating pattern, wherein the first charge storage pattern and the second charge storage pattern are separated from each other by the blocking insulation pattern.

DETAILED DESCRIPTION

Hereinafter, various exemplary embodiments will be described in detail with reference to the accompanying drawings.

In the drawings, thicknesses and length of components are exaggerated for convenience of illustration. In the following description, a detailed explanation of known related functions and constitutions may be omitted for simplicity. Like reference numerals refer to like elements throughout the specification and drawings.

Figure 1:
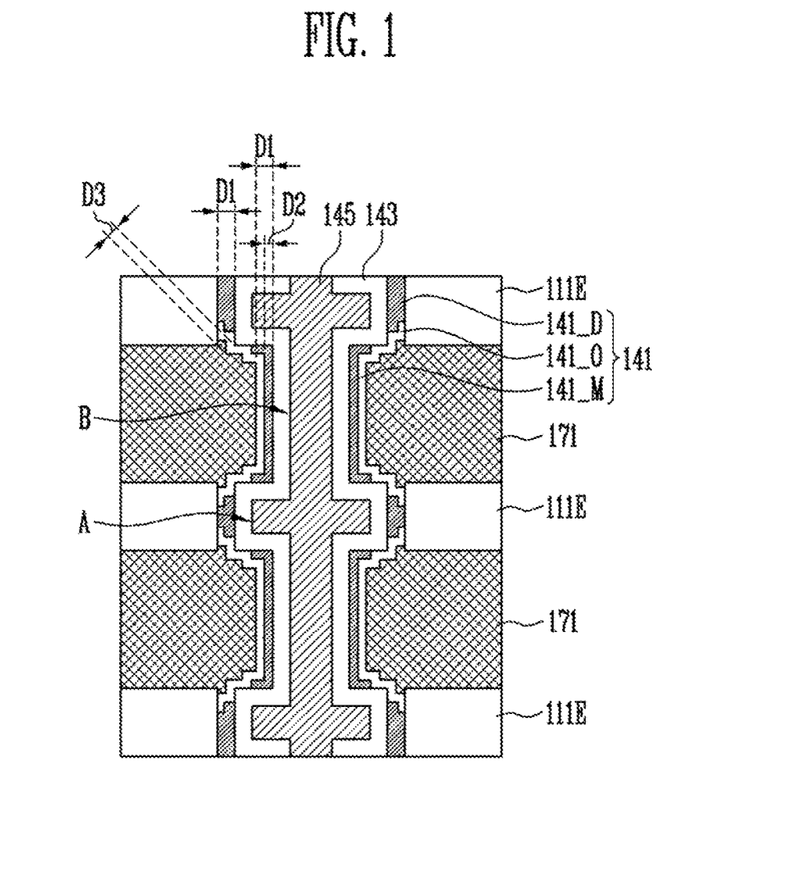
FIG. 1 is a cross-sectional diagram illustrating a semiconductor device according to an embodiment.

FIG. 1 is a cross-sectional view illustrating a semiconductor device according to an embodiment.

As illustrated in FIG. 1, a semiconductor device according to an embodiment may include memory cells stacked over a substrate (not illustrated). The memory cells may be stacked along a channel layer 145 including a sidewall having protrusions (or convex) A and depressions (or concave) B alternating with each other in a direction in which the channel layer 145 extends. The channel layer 145 may extend from a first region to a second region. The first region may be defined as a region in which one of conductive patterns 171 is arranged. The second region may be defined as a region in which one of interlayer insulating patterns 111E is arranged. The memory cells may be arranged between the interlayer insulating patterns 111E. The memory cells may include the channel layer 145, the conductive patterns 171 surrounding the depressions B of the channel layer 145, a tunnel insulating layer 143 surrounding the channel layer 145, and a multifunction layer 141 surrounding the tunnel insulating layer 143.

The channel layer 145 may be formed in a hole that passes through the interlayer insulating patterns 111E and the conductive patterns 171. In other words, each of the conductive patterns 171 may surround the channel layer 145 in the first region and each of the interlayer insulating patterns 111 may surround the channel layer 145 in the second region. The channel layer 145 may protrude further toward the interlayer insulating patterns 111E than the conductive patterns 171. The channel layer 145 may be formed as a buried channel layer by filling the hole with a semiconductor material, as a tube type channel layer by forming a semiconductor material layer on a sidewall of the hole and leaving a central portion of the hole open, or a combination thereof. The central portion of the tube type channel layer 145 may be filled with an insulating material.

The tunnel insulating layer 143 may be formed conformally (i.e., in a liner shape) on a surface of the channel layer 145, include protrusions and depressions, and surround the sidewall of the channel layer 145. The protrusions of the tunnel insulating layer 143 may be formed along a contour of the protrusions A of the channel layer 145. The depressions of the tunnel insulating layer 143 may be formed along a contour of the depressions B of the channel layer 145. The tunnel insulating layer 143 may include a silicon oxide layer. The tunnel insulating layer 143 may be stepped at a border between the first region and the second region to form an edge.

The multifunction layer 141 may be formed conformally on a surface of the tunnel insulating layer 143, include protrusions and depressions, and surround a sidewall of the tunnel insulating layer 143. The protrusions of the multifunction layer 141 may be formed along the protrusions A of the channel layer 145, and the depressions of the multifunction layer 141 may be formed on the depressions B of the channel layer 145. The multifunction layer 141 may include first charge storage patterns 141_M, second charge storage patterns 141_D and blocking insulation patterns 141_O. The first charge storage patterns 141_M and the second charge storage patterns 141_D may include the same material, for example, a silicon nitride layer. The blocking insulation patterns 141_O may include a silicon oxide layer.

The first charge storage patterns 141_M and the blocking insulation patterns 141_O may be formed in the depressions of the multifunction layer 141. More specifically, the first charge storage patterns 141_M may be formed in the depressions of the multifunction layer 141, surround the depressions B of the channel layer 145, and be formed on an outer wall of the tunnel insulating layer 143. In other words, each of the first charge storage patterns 141_M may extend between the channel layer 145 and one of the conductive patterns 171. Surfaces of the first charge storage patterns 141_M may be completely surrounded (or enclosed) by the blocking insulation patterns 141_O and the tunnel insulating layer 143. Each of the first charge storage patterns 141_M may have a C-shaped longitudinal section.

The blocking insulation patterns 141_O may surround the depressions B of the channel layer 145 and be formed on outer walls of the first charge storage patterns 141_M. The blocking insulation patterns 141_O may have a predetermined thickness. In addition, the blocking insulation patterns 141_O may include connecting portions coupled to the tunnel insulating layer 143. The connecting portions of the blocking insulation patterns 141_O may be coupled to the protrusions of the tunnel insulating layer 143. In other words, each of the blocking insulation patterns 141_O may extend from between one of the first charge storage patterns 141_M and one of the conductive patterns 171 to between the channel layer 145 and edges of the interlayer insulating patterns 111. The blocking insulation patterns 141_O may extend via between the tunnel insulating layer 143 and the conductive patterns 171.

The second charge storage patterns 141_D may be disposed in the protrusions of the multifunction layer 141. The second charge storage patterns 141_D may surround the protrusions A of the channel layer 145 and be formed on the outer wall of the tunnel insulating layer 143. In other words, each of the second charge storage patterns 141_D may extend between the channel layer 145 and one of the interlayer insulating patterns 111. The second charge storage patterns 141_D may be separated from the first charge storage patterns 141_M by the blocking insulation patterns 141_O. The tunnel insulating layer 143 may extend from between the channel layer 145 and the first storage patterns 141_M to between the channel layer 145 and the second storage patterns 141_D.

The first charge storage patterns 141_M and the second charge storage patterns 141_D may be non-oxidized areas of the multifunction layer 141. The blocking insulation patterns 141_O may be oxidized areas of the multifunction layer 141. Charges may be trapped in the first charge storage patterns 141_M. The blocking insulation patterns 141_O may block the movement of the charges from the first charge storage patterns 141_M toward the second charge storage patterns 141_D.

Each of the depressions of the multifunction layer 141 may include the blocking insulation pattern 141_O, which is the oxidized area of the multifunction layer 141, and the first charge storage pattern 141_M, which is the non-oxidized area of the multifunction layer 141. Therefore, the first charge storage patterns 141_M may have a second thickness D2 smaller than a first thickness D1, which is a deposition thickness of the multifunction layer 141. Since the second charge storage patterns 141_D are arranged in the protrusions of the multifunction layer 141, protected by the interlayer insulating patterns 111E, the second charge storage patterns 141_D may maintain the first thickness D1 and have a greater thickness than the second thickness D2.

The blocking insulation patterns 141_O may be coupled to edges of the protrusions of the tunnel insulating layer 143 and separate the first charge storage patterns 141_M and the second charge storage patterns 141_D. An oxidation process of forming the blocking insulation patterns 141_O may be performed such that portions of the blocking insulation patterns 141_O surrounding edges of the protrusions A of the channel layer 145 may contact the tunnel insulating layer 143 and the first charge storage patterns 141_M may remain at a predetermined thickness as non-oxidized regions surrounding the depressions B of the channel layer 145. The multifunction layer 141 may have the smallest thickness D3 at the edges of the protrusions thereof. Both ends of each of the blocking insulation patterns 141_O may have a stepped structure due to an etch process. In other words, each of the blocking insulation patterns 141_O may extend between the stepped edge of the tunnel insulating layer 143 and one of the conductive patterns 171 at the border between the first region and the second region.

Each of the interlayer insulating patterns 111E may surround each of the second charge storage patterns 141_D. The conductive patterns 171 may be formed between the interlayer insulating patterns 111E and surround the blocking insulation patterns 141_O. The conductive patterns 171 may protrude further toward the channel layer 145 than the interlayer insulating patterns 111E and surround the edges of the interlayer insulating patterns 111E. Therefore, the volume of the conductive patterns 171 may be increased to reduce resistance of the conductive patterns 171.

Both ends of each of the blocking insulation patterns 141_O may extend between the interlayer insulating patterns 111E and the tunnel insulating layer 143 to surround the edges of the protrusions A of the channel layer 145.

According to an embodiment, the blocking insulation pattern 141_O may be easily formed by oxidizing a protrusion of a base layer 141A, as shown below in FIG. 2D. In addition, according to an embodiment, by selectively oxidizing edges of protrusions of the base layer 141A, the blocking insulation pattern 141_O may be easily coupled to the tunnel insulating layer 143 so that the multifunction layer 141 may be easily separated into the first charge storage pattern 141_M and the second charge storage pattern 141_D. Therefore, according to an embodiment, the vertical movement of charges along the multifunction layer 141 may be prevented by the blocking insulation pattern 141_O.

According to an embodiment, since the first charge storage patterns 141_M and the blocking insulation patterns 141_O constituting a single memory string may be formed using a single base layer 141A, an interface between the first charge storage patterns 141_M and the blocking insulation patterns 141_O does not have undesirable charge-trapping characteristics. That is, an interface formed between different material layers through a deposition process may have a characteristic that charges are trapped in the interface. However, according to an embodiment, reliability of the semiconductor device may be improved by preventing an undesirable interface from being formed between the first charge storage patterns 141_M and the blocking insulation patterns 141_O.

FIGS. 2A to 2J are cross-sectional views illustrating a method of manufacturing a semiconductor device according to an embodiment.

Figure 2A:
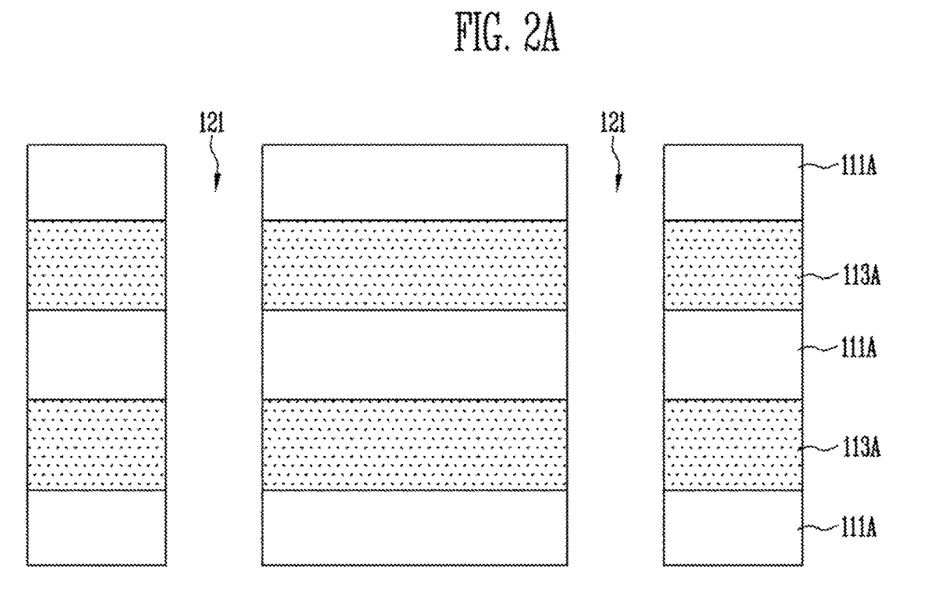
FIGS. 2A to 2J are cross-sectional views illustrating a method of manufacturing a semiconductor device according to an embodiment.

Referring to FIG. 2A, interlayer insulating layers 111A and sacrificial layers 113A may be alternately stacked over a substrate (not illustrated) including a lower structure. The lower structure may include a source region. The source region may be formed by implanting impurities into the substrate, or by forming a doped polysilicon layer over the substrate and patterning the doped polysilicon layer. Alternatively, the lower structure may include a pipe gate including a pipe trench.

The interlayer insulating layers 111A may be an oxide layer such as a silicon oxide layer. The sacrificial layers 113A may have an etch selectivity different from the interlayer insulating layers 111A. For example, the sacrificial layers 113A may include a silicon nitride layer.

Subsequently, the interlayer insulating layers 111A and the sacrificial layers 113A may be etched to form holes 121 through the interlayer insulating layers 111A and the sacrificial layers 113A.

Figure 2B:
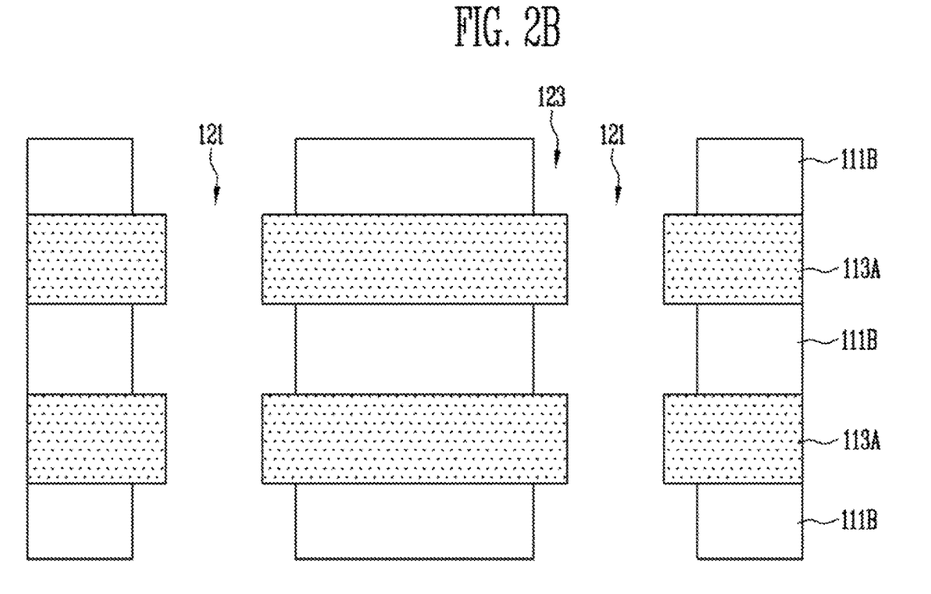

Referring to FIG. 2B, portions of the interlayer insulating layers 111A exposed by the holes 121 may be etched to form first openings 123 through which sidewalls of the sacrificial layers 113A are opened by a predetermined thickness. As a result, first interlayer insulating patterns 111B may be divided from each other by the first openings 123 and the holes 121, and the sacrificial layers 113A may extend further toward the holes 121 than the first interlayer insulating patterns 111B.

Figure 2C:
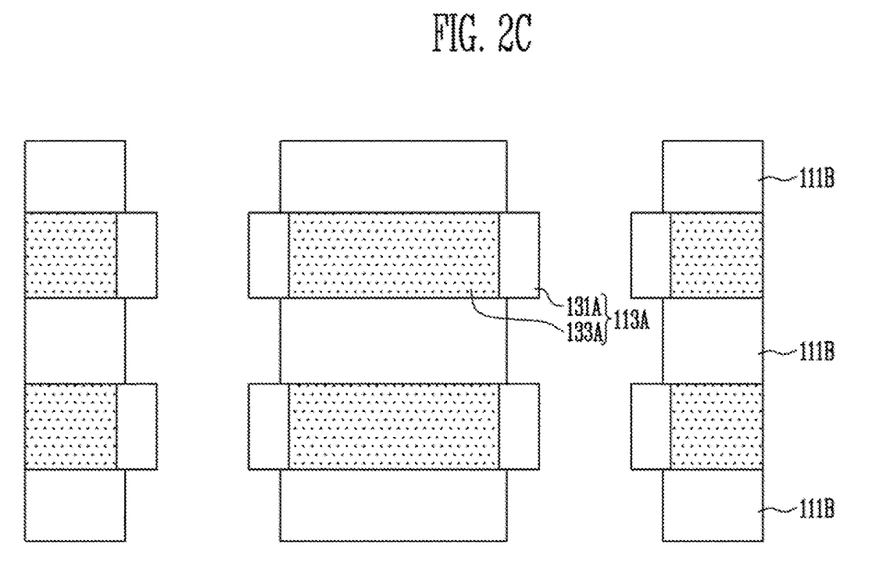

Referring to FIG. 2C, portions of the sacrificial layers 113A exposed by the first openings 123 may be oxidized to form first oxidized regions 131A. The other areas of the sacrificial layers 113A, except for the first oxidized regions, 131A may remain as non-oxidized regions 133A. Each of the first oxidized regions 131A may surround each of the holes 121, and each of the non-oxidized regions 133A may surround each of the first oxidized regions 131A.

Figure 2D:
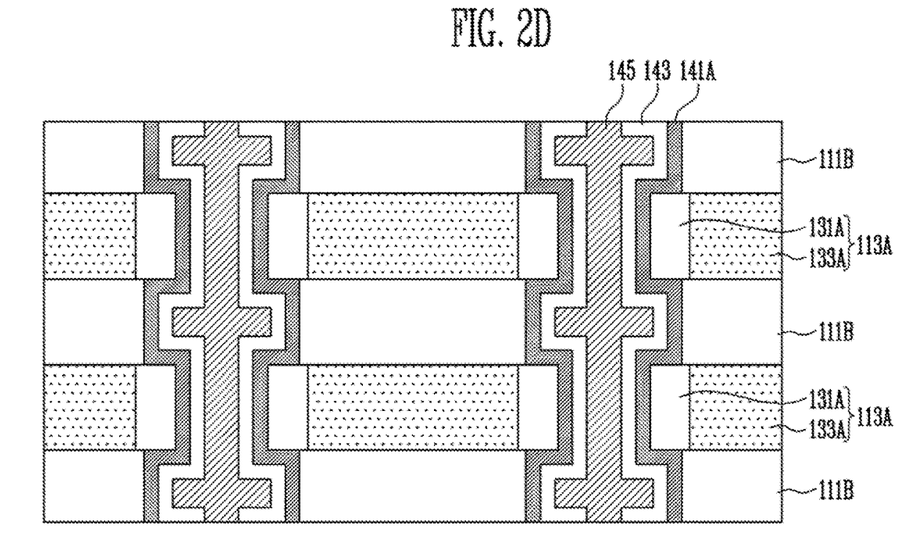

Referring to FIG. 2D, the base layer 141A may be formed along a sidewall of each of the holes 121 including the first openings 123. The base layer 141A may include protrusions contacting the first interlayer insulating patterns 111B and depressions contacting the sacrificial layers 113A. The base layer 141A may include a polysilicon layer capable of storing charges or a silicon nitride layer capable of trapping charges. The base layer 141A may be a single layer.

Subsequently, the tunnel insulating layer 143 may be formed on the base layer 141A. The tunnel insulating layer 143 may include protrusions formed on surfaces of the first openings 123 and depressions formed on sidewalls of the sacrificial layers 113A between the first openings 123.

Subsequently, each of the holes 121 including the first openings 123 may be filled with the channel layer 145. As described above with reference to FIG. 1, the channel layer 145 may be formed as a buried channel layer, a tube type channel layer, or a combination thereof. The channel layer 145 may be formed on an inner wall of the tunnel insulating layer 143 and include protrusions and depressions. The protrusions of the channel layer 145 may extend further toward the first interlayer insulating patterns 111B than the depressions thereof.

Figure 2E:
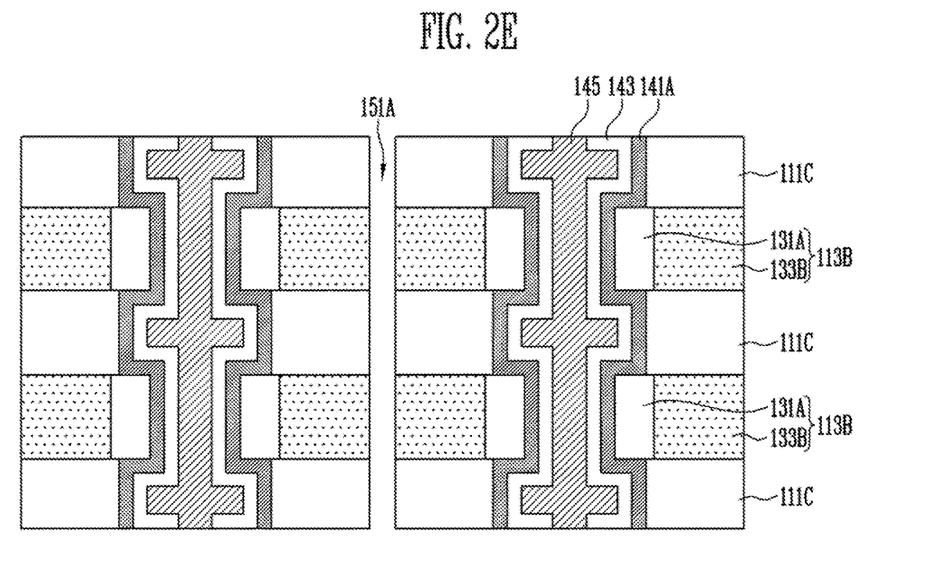

Referring to FIG. 2E, a first slit 151A may be formed between the holes 121. The first slit 151A passes through the first interlayer insulating patterns 111B and non-oxidized regions 133A of the sacrificial layers 113A. As a result, second interlayer insulating patterns 111C and sacrificial layer patterns 113B which are divided by the first slit 151A may be formed. The sacrificial layer patterns 113B may include the first oxidized regions 131A and the non-oxidized regions 133B divided by the first slit 151A.

Figure 2F:
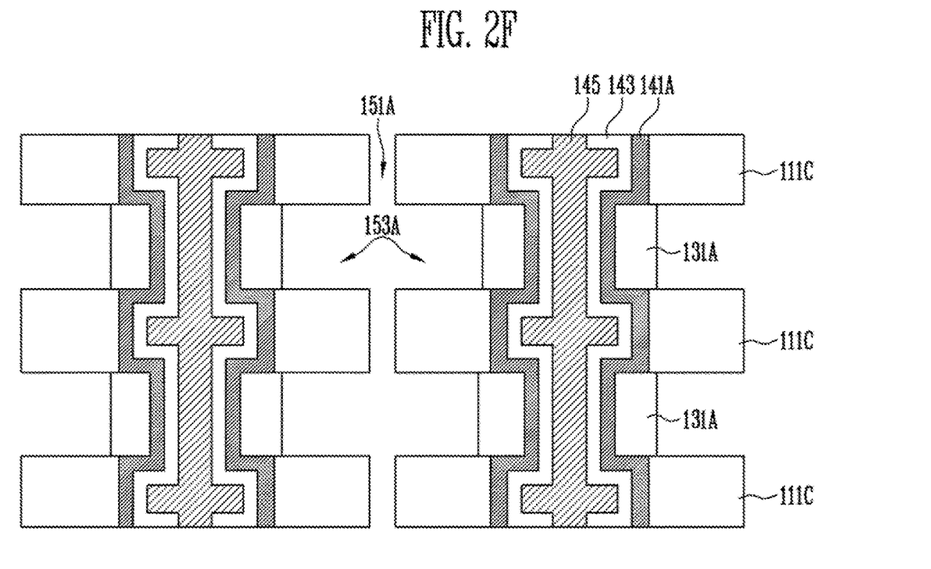

Referring to FIG. 2F, the non-oxidized regions 133B exposed by the first slit 151A may be removed to form second openings 153A. As a result, the first oxidized regions 131A may be exposed by the second openings 153A.

Figure 2G:
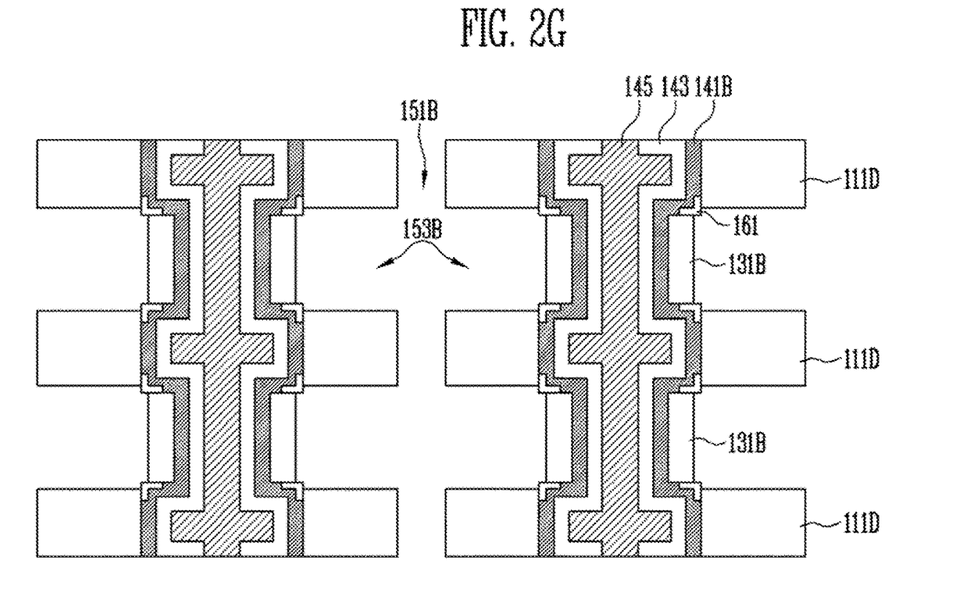

Referring to FIG. 2G, the first oxidized regions 131A may be etched by a predetermined thickness to expose edges of the protrusions of the base layer 141A. The second interlayer insulating patterns 111C also may be partially etched by a predetermined thickness. That is, a portion of the second interlayer insulating patterns 111C that is exposed by the first slit 151A and the second openings 153A may be subject to etching. As a result, third interlayer insulating patterns 111D may be formed so that the third interlayer insulating patterns 111D may be divided by a second slit 151B and the third openings 153B. The third openings 153B have an increased size compared to the second openings 153A shown in FIG. 2F.

Upon formation of the third interlayer insulating patterns 111D and the third openings 153B, edges of the protrusions of the base layer 141A may be exposed. Subsequently, the edges of the protrusions of the base layer 141A may be oxidized by a predetermined thickness to form second oxidized regions 161. The other areas of the base layer 141A, except for the second oxidized regions 161, may remain as non-oxidized regions 141B. Since the second oxidized regions 161 are formed, the non-oxidized regions 141B may be thin at edges of the protrusions of the base layer 141A.

Figure 2H:
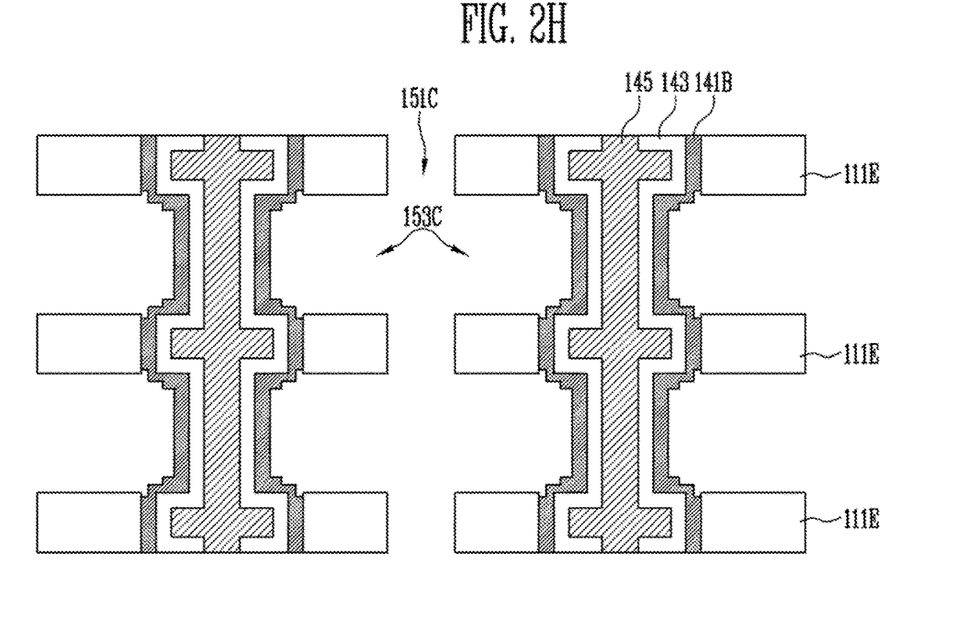

Referring to FIG. 2H, the second oxidized regions 161 and the remaining first oxidized regions 131B may be removed. As a result, the edges of the protrusions and the depressions of the non-oxidized regions 141B may be exposed. While the second oxidized regions 161 and the remaining first oxidized regions 131B are removed, the third interlayer insulating patterns 111D may be further etched by a predetermined thickness. For example, the third interlayer insulating patterns 111D exposed by the second slit 151B and the third openings 153B may be attacked. As a result, fourth interlayer insulating patterns 111E may be formed so that the fourth interlayer insulating patterns 111E may be divided from each other by a third slit 151C and the fourth openings 153C with increased sizes compared to the second slit 151B and the third openings 151B shown in FIG. 2G.

According to the above-described processes, the edges of the protrusions of the non-oxidized regions 141B may have a stepped structure.

Figure 2I:
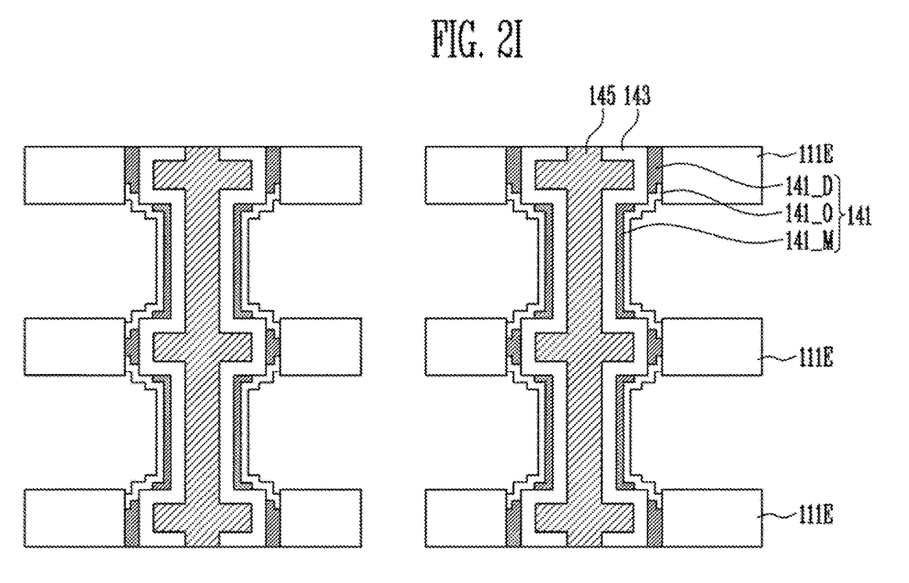

Referring to FIG. 2I, the depressions and the edges of the protrusions of the non-oxidized regions 141B may be oxidized to form the blocking insulation patterns 141_O. An oxidation process for forming the blocking insulation patterns 141_O may be performed so that the blocking insulation patterns 141_O may contact the edges of the protrusions of the tunnel insulating layer 143. Even when the blocking insulation patterns 141_O are oxidized from the edges of the protrusions of the non-oxidized regions 141B and connected to the tunnel insulating layer 143, the depressions of the non-oxidized regions 141B having a relatively great thickness may remain without being oxidized, forming a first charge storage pattern 141_M. Therefore, the blocking insulation patterns 141_O may be separated from the depressions of the tunnel insulating layer 143 by the first charge storage patterns 141_M. As a result, the final remaining multifunction layer 141 may include the protrusions and the depressions. The second charge storage patterns 141_D may be disposed in the protrusions of the multifunction layer 141, and the blocking insulation patterns 141_O and the first charge storage patterns 141_M may be disposed in the depressions of the multifunction layer 141. According to the above-described processes, the thickness of the first charge storage patterns 141_M may be smaller than that of the second charge storage patterns 141_D.

According to an embodiment, in FIG. 2I, the oxidized region of the multifunction layer 141 may not be completely removed and thus the tunnel insulating layer 143 may not be exposed. That is, the oxidized region of the multifunction layer 141 may remain so that the tunnel insulating layer 143 is not exposed. The remaining oxidized region of the multifunction layer 141 may be used as the blocking insulation pattern 141_O. When the oxidized region of the multifunction layer 141 is completely removed, the tunnel insulating layer 143 may be damaged. In an embodiment, since the oxidized region of the multifunction layer 141 may remain, the tunnel insulating layer 143 may be prevented from being damaged.

According to an embodiment, processes may be simplified since charge storage patterns and blocking insulation patterns are formed by using the single base layer 141A, as shown in FIG. 2D, without separately forming a material layer for charge storage patterns and a material layer for blocking insulation pattern by using separate deposition processes.

Figure 2J:
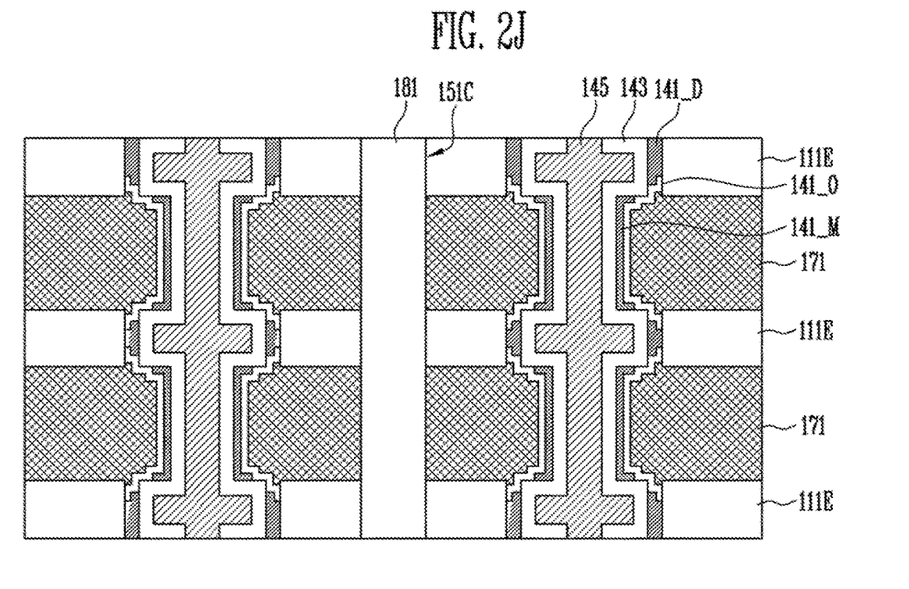

Referring to FIG. 2J, spaces between the fourth interlayer insulating patterns 111E, which is formed by removing the first oxidized regions 131A, shown in FIG. 2E, the second oxidized regions 161, shown in FIG. 2G, and the non-oxidized regions 133B of the sacrificial patterns 113B, shown in FIG. 2E, may be filled with conductive patterns 171. The conductive patterns 171 may include at least one of polysilicon, a metal silicide layer and a metal layer. The conductive patterns 171 may further include a metal barrier layer. Spaces between the fourth interlayer insulating patterns 111E may be expanded when portions of the first oxidized regions 131A, described above with reference to FIG. 2G, are etched and when the second oxidized regions 161 described with reference to FIG. 2H, and the remaining first oxidized regions 131B are removed. Therefore, it may be easier to fill the spaces between the fourth interlayer insulating patterns 111E with the conductive patterns 171, and resistance of the conductive patterns 171 may be reduced. In addition, though not shown in FIG. 2J, a blocking insulating layer may be further formed before the conductive patterns 171 are formed.

After the conductive patterns 171 are formed, subsequent processes such as filling the third slit 151C with an insulating layer 181 may be performed.

Figure 3:
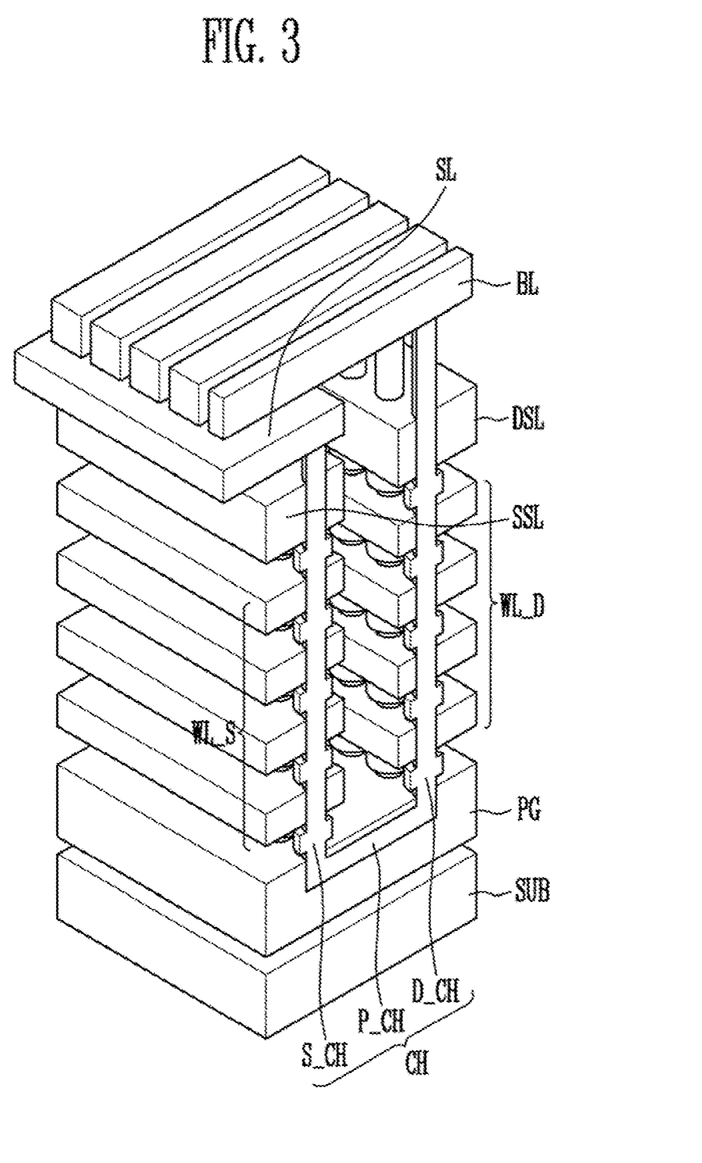
FIGS. 3 and 4 are perspective views illustrating cell structures of a semiconductor device according to embodiments.
Figure 4:
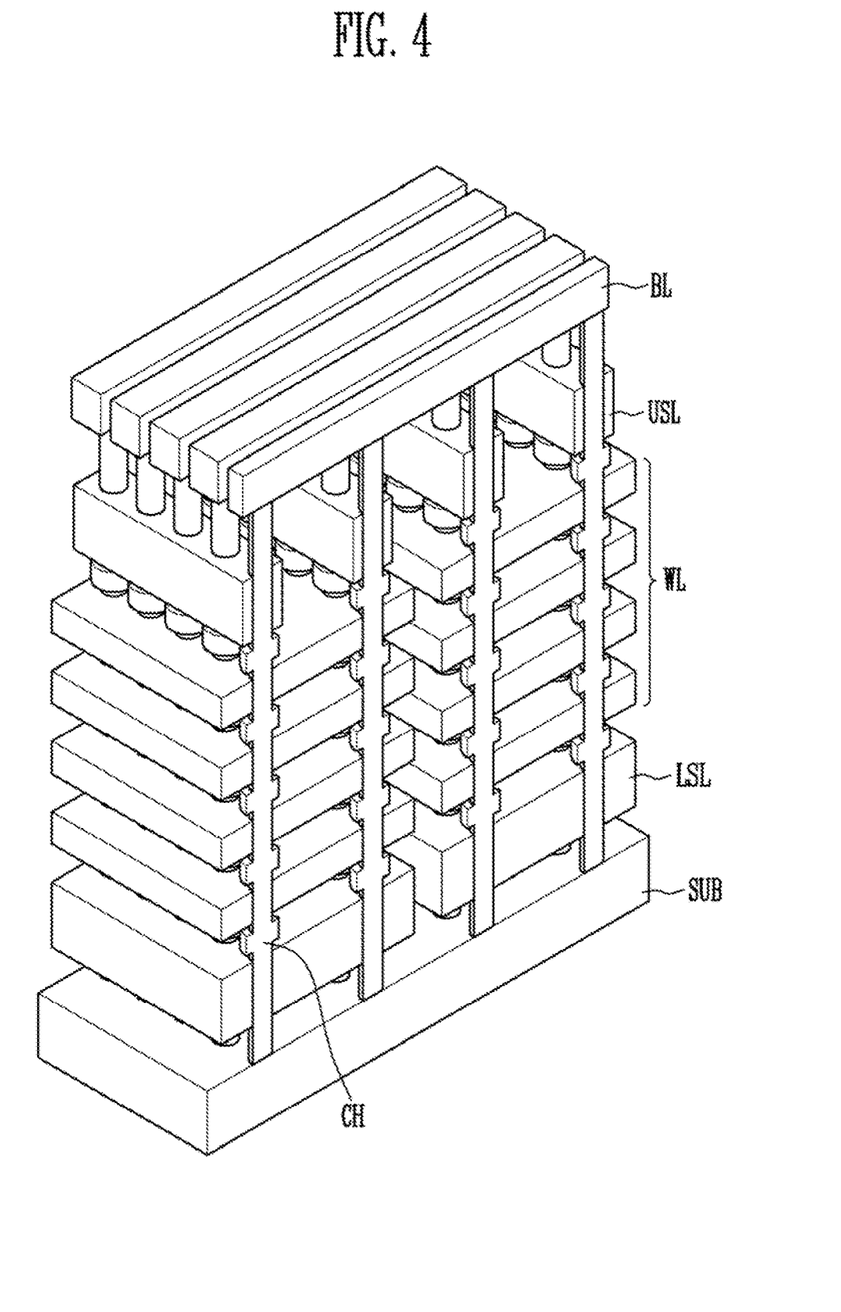

FIGS. 3 and 4 are perspective views illustrating cell structures of a semiconductor device according to embodiments. In FIGS. 3 and 4, interlayer insulating patterns, a tunnel insulating layer formed along a surface of the channel layer CH, and a multifunction layer are not illustrated.

Referring to FIG. 3, memory cells may be arranged along the U-shaped channel layer CH to form a three-dimensional memory string.

As illustrated in FIG. 3, a cell structure may include a pipe gate PG, word lines WL_D and WL_S, at least one source selection line SSL and at least one drain selection line DSL which are respectively stacked over a substrate SUB. The cell structure may include the U-shaped channel layer CH.

The word lines WL_D and WL_S may correspond to the conductive patterns described above with reference to FIG. 1.

The channel layer CH may include a pipe channel layer P_CH, a source side channel layer S_CH protruding from the pipe channel layer P_CH, and a drain side channel layer D_CH protruding from the pipe channel layer P_CH. In FIG. 3, a pair of the source side channel layer S_CH and the drain side channel layer D_CH may be coupled to the pipe channel layer P_CH. However, depending on the shape of the memory string, two or more source side channel layers S_CH may be coupled to the pipe channel layer P_CH, and two or more drain side channel layers D_CH may be coupled to the pipe channel layer P_CH.

The source side channel layer S_CH may pass through the source side word lines WL_S and a source selection line SSL. Likewise, the drain side channel layer D_CH may pass through the drain side word lines WL_D and a drain selection line DSL. The source side channel layer S_CH may be coupled to a source line SL, and the drain side channel layer D_CH may be coupled to a bit line BL.

As described above with reference to FIG. 1, the source side channel layer S_CH and the drain side channel layer D_CH may include protrusions and depressions. Sidewalls of the source side channel layer S_CH and the drain side channel layer D_CH may be surrounded by a tunnel insulating layer and a multifunction layer having the same structures as described above. The tunnel insulating layer and the multifunction layer may be extended to surround the pipe gate PG.

In the above-described cell structure, at least one drain selection transistor, memory cells, and at least one source selection transistor coupled in series to each other may form a single memory string and be arranged in a U shape.

The above-described cell structure may be formed by using the processes described above with reference to FIGS. 2A to 2J after the pipe gate PG is formed.

Referring to FIG. 4, memory cells may be arranged along a straight type channel layer CH to form a three-dimensional memory string.

As illustrated in FIG. 4, a cell structure may include at least one lower selection line LSL, word lines WL, and at least one upper selection line USL which are sequentially stacked over the substrate SUB that includes a source region. The cell structure may include the straight type channel layer CH coupled to the substrate SUB.

The word lines WL may correspond to the conductive patterns described above with reference to FIG. 1.

The channel layer CH may be coupled between the substrate SUB and the bit lines BL. The channel layer CH may be coupled to the source region of the substrate SUB. As described above with reference to FIG. 1, the channel layer CH may include protrusions and depressions. An outer wall of the channel layer CH may be surrounded by a tunnel insulating layer and a multifunction layer, as described above with reference to FIG. 1.

In the above-described structure, at least one lower selection transistor, memory cells, and at least one upper selection transistor may form a single memory string and be stacked in line.

The above-described cell structure may be formed using the processes described above with reference to FIGS. 2A to 2J.

Figure 5:
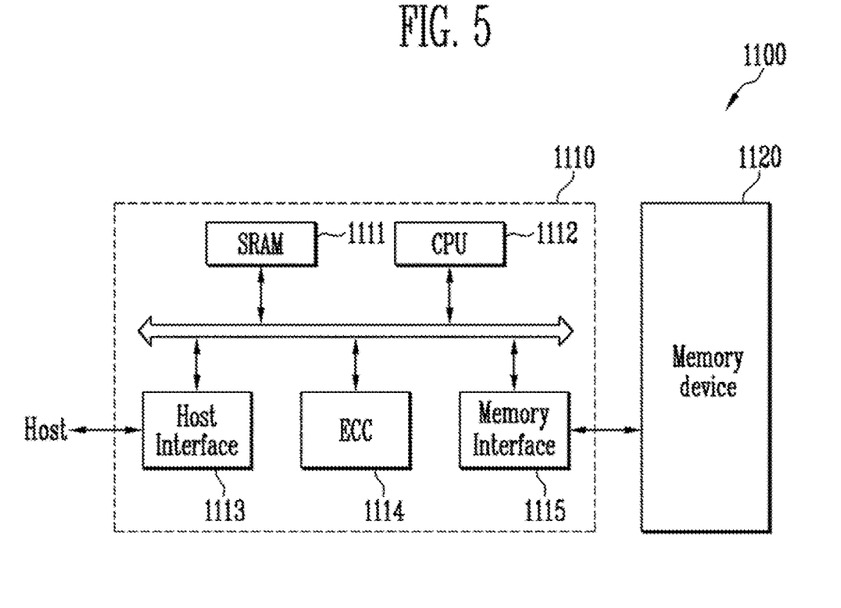
FIG. 5 is a view illustrating the configuration of a memory system according to an embodiment.

FIG. 5 is a block diagram illustrating the configuration of a memory system according to an embodiment.

As illustrated in FIG. 5, a memory system 1100 according to an embodiment may include a non-volatile memory device 1120 and a memory controller 1110.

The non-volatile memory device 1120 may have the above-described structure. In addition, the non-volatile memory device 1120 may be a multi-chip package including a plurality of flash memory chips.

The memory controller 1110 may be configured to control the non-volatile memory device 1120. The memory controller 1110 may include static random access memory (SRAM) 1111, a central processing unit (CPU) 1112, a host interface 1113, an error correction code (ECC) 1114 and a memory interface 1115. The SRAM 1111 may function as an operation memory of the CPU 1112. The CPU 1112 may perform general control operations for data exchange with the memory controller 1110. The host interface 1113 may include a data exchange protocol for a host coupled to the memory system 1100. In addition, the ECC 1114 may detect and correct errors included in data read from the non-volatile memory device 1120. The memory interface 1115 may interface between the non-volatile memory device 1120 and a memory controller 1110. The memory controller 1110 may further include a read-only memory (ROM) that stores code data to interface with the host.

The memory system 1100 having the above-described configuration may be a solid state disk (SSD) or a memory card in which the memory device 1120 and the memory controller 1110 are combined. For example, when the memory system 1100 is an SSD, the memory controller 1110 may communicate with an external device (e.g., a host) through one of the interface protocols including Universal Serial Bus (USB), MultiMediaCard (MMC), Peripheral Component Interconnect-Express (PCI-E), Serial-Advanced Technology Attachment (SATA), Parallel-Advanced Technology Attachment (PATA), Small Computer System Interface (SCSI), Enhanced Small Disk Interface (ESDI) and Integrated Drive Electronics (IDE).

Figure 6:
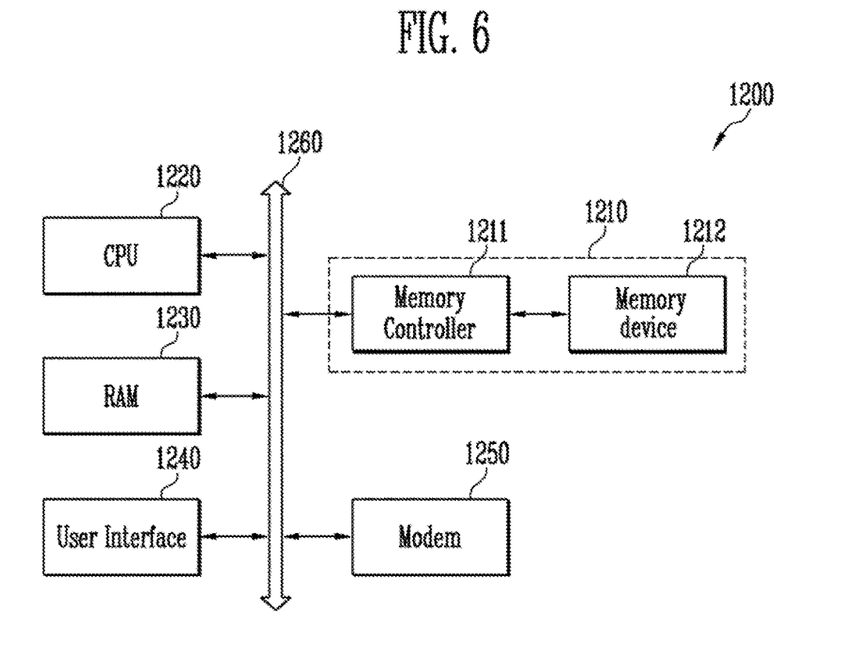
FIG. 6 is a view illustrating the configuration of a memory system according to another embodiment.

FIG. 6 is a block diagram illustrating the configuration of a computing system according to an embodiment.

As illustrated in FIG. 6, a computing system 1200 according to an embodiment may include a CPU 1220, RAM 1230, a user interface 1240, a modem 1250 and a memory system 1210 that are electrically coupled to each other by a system bus 1260. In addition, when the computing system 1200 is a mobile device, a battery may be further included to apply an operating voltage to the computing system 1200. The computing system 1200 may further include application chipsets, a Camera Image Processor (CIS), or mobile DRAM.

As described above in connection with FIG. 5, the memory system 1210 may include a non-volatile memory 1212 and a memory controller 1211.

According to an embodiment, a blocking insulation pattern may be easily formed by oxidizing a protrusion of a base layer.

According to an embodiment, an edge of the protrusion of the base layer may be oxidized to allow the blocking insulation pattern to be easily coupled to a tunnel insulating layer, so that the base layer may be easily separated into a first charge storage pattern and a second charge storage pattern. Therefore, according to an embodiment, a multifunction layer including the first charge storage pattern and the second charge storage pattern, separated from each other by the blocking insulation pattern, may be formed to prevent vertical movement of charges along the multifunction layer. Thus, reliability of the semiconductor device may improve.

What is claimed is:

1. A method of manufacturing a semiconductor device, the method comprising:
   forming a stacked structure including interlayer insulating layers and sacrificial layers that are stacked alternately and penetrated by a hole, wherein the sacrificial layers include first oxidized regions surrounding the hole and non-oxidized regions surrounding the first oxidized regions, wherein the sacrificial layers extend farther toward the hole than the interlayer insulating layers;
   forming a base layer along a sidewall of the hole, wherein the base layer includes protrusions formed over the interlayer insulating layers and depressions formed over the sacrificial layers;
   removing the non-oxidized regions of the sacrificial layers to expose the first oxidized regions of the sacrificial layers;
   partially etching the first oxidized regions of the sacrificial layers to expose edges of the protrusions of the base layer;
   forming second oxidized regions by oxidizing the edges of the protrusions of the base layer to a predetermined thickness;
   exposing the depressions of the base layer and the edges of the protrusions of the base layer by removing the second oxidized regions of the base layer and the first oxidized regions of the sacrificial layers; and
   forming blocking insulation patterns by oxidizing the edges of the protrusions of the base layer and the depressions of the base layer.

2. The method of claim 1, wherein the forming of the stacked structure comprises:
   alternately stacking the interlayer insulating layers and the sacrificial layers;
   forming the hole extending through the interlayer insulating layers and the sacrificial layers;
   etching portions of the interlayer insulating layers exposed by the hole to form openings through which sidewalls of the sacrificial layers are exposed by a predetermined thickness; and
   forming the first oxidized regions by oxidizing the exposed sidewalls of the sacrificial layers.

3. The method of claim 1, further comprising, before the removing of the non-oxidized regions of the sacrificial layers:
   forming a tunnel insulating layer over a surface of the base layer; and
   forming a channel layer over the tunnel insulating layer by filling the hole.

4. The method of claim 3, wherein the forming of the blocking insulating patterns is performed until the blocking insulation patterns contact the tunnel insulating layer at edges of the protrusions of the base layer.

5. The method of claim 1, wherein the removing of the non-oxidized regions of the sacrificial layers includes forming a slit extending through the stacked structure to expose the non-oxidized regions.

\* \* \* \* \*